US006909637B2

(12) United States Patent
Nelson et al.

(10) Patent No.: US 6,909,637 B2
(45) Date of Patent: Jun. 21, 2005

(54) FULL RAIL DRIVE ENHANCEMENT TO DIFFERENTIAL SEU HARDENING CIRCUIT WHILE LOADING DATA

(75) Inventors: David K. Nelson, Medicine Lake, MN (US); Keith W. Golke, Minneapolis, MN (US)

(73) Assignee: Honeywell International, Inc., Morristown, NJ (US)

( * ) Notice: Subject to any disclaimer, the term of this patent is extended or adjusted under 35 U.S.C. 154(b) by 236 days.

(21) Appl. No.: 10/306,465

(22) Filed: Nov. 27, 2002

(65) Prior Publication Data

US 2004/0100320 A1 May 27, 2004

(51) Int. Cl.[7] .............................................. G11C 16/04
(52) U.S. Cl. .............. 365/185.07; 365/154; 365/185.18
(58) Field of Search ........................... 365/185.07, 154, 365/185.18, 156, 189.05, 181, 190, 78, 205, 208, 211; 327/211

(56) References Cited

U.S. PATENT DOCUMENTS

| 4,638,463 | A | | 1/1987 | Rockett, Jr. | |
|---|---|---|---|---|---|
| 5,111,429 | A | * | 5/1992 | Whitaker | 365/156 |
| 5,504,703 | A | * | 4/1996 | Bansal | 365/156 |
| 5,640,341 | A | * | 6/1997 | Bessot et al. | 365/156 |
| 6,058,041 | A | * | 5/2000 | Golke et al. | 365/156 |
| 6,259,643 | B1 | * | 7/2001 | Li | 365/206 |
| 6,285,580 | B1 | * | 9/2001 | Phan et al. | 365/156 |
| 6,608,512 | B2 | * | 8/2003 | Ta et al. | 327/211 |

FOREIGN PATENT DOCUMENTS

| EP | 0 335 008 A1 | 10/1989 |
|---|---|---|
| WO | WO 03/058628 A1 | 7/2003 |

OTHER PUBLICATIONS

T. Calin et al., "Upset Hardened Memory Design for Sub-micron CMOS Technology", IEEE Transactions on Nuclear Science, vol. 43, No. 6, Dec. 1996, pp. 2874–2878.

Rockett, Jr., "An Seu–Hardened CMOS Data Latch Design", IEEE Transactions on Nuclear Science, vol. 35, No. 6, Dec. 1988, pp. 1682–1687.

* cited by examiner

Primary Examiner—Van Thu Nguyen
Assistant Examiner—Dang Nguyen
(74) Attorney, Agent, or Firm—Schiff Hardin LLP

(57) ABSTRACT

A hardening system includes a data storage device having a data input, a clock input, a data node Q, and a data complement node QN. The data storage device provides drive to the data node Q and the data complement node QN. A hardening circuit includes first, second, third, fourth, and fifth transistor circuits. The first and second transistor circuits form a first node therebetween, and the first transistor circuit prevents the data node Q from changing states in the presence of radiation. The third and fourth transistor circuits form a second node therebetween, and the third transistor circuit prevents the data complement node QN from changing states in the presence of radiation. The first node is coupled to the third transistor circuit, and the second node is coupled to the first transistor circuit. The fifth transistor circuit prevents the first and second nodes from floating.

56 Claims, 7 Drawing Sheets

US 6,909,637 B2

FULL RAIL DRIVE ENHANCEMENT TO DIFFERENTIAL SEU HARDENING CIRCUIT WHILE LOADING DATA

TECHNICAL FIELD OF THE INVENTION

The present invention is directed to the hardening of an integrated circuit against single event upsets. The hardening circuit provides differential drive to harden storage element circuits against single event upsets. The hardening circuit is completely turned off while loading data into the storage element.

BACKGROUND OF THE INVENTION

Integrated circuits are frequently used in the presence of radiation. Radiation, which can be in the form of x-rays, gamma-rays, photons, or particles, deposit charge in silicon and, therefore, can cause upsets in the integrated circuits. The most common upset causes are from particles such as protons, neutrons, and heavy ions. As a result of such radiation, charges can be collected at circuit nodes that send the nodes to opposite voltage states (e.g., from high to low). When this voltage state change happens to a data storage circuit, the affected data storage nodes improperly change to the opposite data states.

All circuits can tolerate some amount of deposited charge that does not cause a data state change. However, all circuits also have some deposited charge threshold above which the data state will be changed. This threshold is referred to as the critical charge (i.e., Qcrit) for upset. Such data state changes are defined as radiation induced upsets. When radiation particles, which are particles that are discrete in time and space, cause a data upset, the data upset is referred to as a single event upset (SEU).

For a circuit node to collect charge, a particle must penetrate the silicon region coupled to that node, and the particle must also pass through, or be close to, a voltage gradient. Charge is only collected from silicon regions where the time that the charge drifts or diffuses into a voltage gradient is greater than the recombination time. An shown in FIG. 1, a portion of an integrated circuit 10 includes a reverse biased pn junction 12 such as found on the drain of an off n-channel transistor (an n-channel transistor in an off state) that is being driven high by a p-channel transistor.

As shown in FIG. 1, a particle passes along track #1 through the n-channel drain pn junction and the depletion region of the integrated circuit 10. As a result, hole-electron pairs are generated along the entire length of track #1. The number of such generated hole-electron pairs is dependent on the mass and energy of the particle.

In the N+ region shown in FIG. 1, the concentration of impurities is typically so high that lifetimes are very short. Therefore, the generated hole-electron pairs in the N+ region recombine before they can move.

In the depletion region, however, there is an electric field that quickly separates the holes and electrons, sending the holes to the P− region and the electrons to the N+ region before they can recombine. Charge that moves under the influence of an electric field is known as drift current. The holes and electrons are majority carriers in these regions and, therefore, create a current that discharges the V+ node and charges the ground node.

In the P− region, lifetimes are much longer than in the N+ region. Therefore, there is time for the holes and electrons to diffuse away from the particle track. The movement of charge from regions of high concentration to regions with lower charge concentration is known as diffusion current. Some holes and electrons diffuse toward the depletion region. The electrons diffusing toward the depletion region accelerate across and into the N+ region. However, the holes diffusing toward the depletion region are thrown back into the P− region.

Accordingly, the particle moving along track #1 creates a sudden discharge current on the V+ node. If the amount of collected charge is large enough to overcome the capacitance and V+ drive at this portion of the integrated circuit 10 (i.e., the p-channel transistor does not have sufficient drive to prevent the V+ node from discharging to ground), and if this node is part of a feedback path, then the particle moving along track #1 could result in a change of (i.e., an error in) the stored data state. If the data state does change, this change is known as a SEU (single event upset).

Likewise, a reverse biased pn junction such as found on the drain of an off p-channel transistor being driven by an n-channel transistor can experience a similar charging current from a particle passing through it.

The time that it takes the radiation particle to traverse the depletion region and generate the hole-electron pairs is on the order of a picosecond, which is much shorter than typical system operating frequencies. The time that it takes the charge to traverse the depletion region is also on the order of picoseconds. Lifetimes in the P− region are much longer. Thus, the nature of the current produced by a radiation particle traversing a reverse biased pn junction begins as a large current pulse of short duration (the charge deposited in the depletion region traversing this depletion region, i.e., drift current). This pulse is followed by a much smaller current of longer duration (the charge deposited outside the depletion region diffusing to the depletion region, i.e., diffusion current, and then traversing the depletion region). Generally, it is the initial large current pulse to which a data storage circuit is most vulnerable. Thus the stored data state disturbing current produced by a radiation particle is a transient phenomena that occurs in a time much smaller than operating frequencies.

Because the data state of a node upset by a radiation particle passing through it can be restored by rewriting the original stored data state, the change in state of the upset node is known as a soft error. There is a time and spatial distribution of particles that have a range of mass and energy. An upset can only be predicted in terms of the probability (i.e., rate) of a particle with sufficient mass and energy to traverse a depletion region with a sufficiently long track length of deposited charge that exceeds Qcrit. The rate at which these soft errors occur is known as the soft error rate (SER). The SER is proportional to the volume of the sensitive region and is inversely proportional to Qcrit.

If the N+ region in FIG. 1 is at ground instead of at V+ as shown, there is no reverse biased depletion region. Instead, there is only the space charge region typically associated with the built-in pn junction potential of 0.7V. At least in some respects, the behavior of the node with a grounded N+ region is similar to the reverse biased conditions described above. That is, when a particle passes through the space charge region of this node whose N+ region is grounded, the deposited charge discharges the N+ node. However, when the grounded N+ region discharges to −0.7V, the pn junction becomes forward biased, and holes consequently sweep into the N+ region to recombine with the electrons that were initially swept into the N+ region.

Thus, the maximum voltage change for the N+ region of this node is −0.7V, which actually is a harder low state on the node. Accordingly, a radiation particle passing along track #1 of FIG. 1, where the N+ region is grounded, cannot create an SEU. Likewise, a P+/N− junction where both sides are high at VDD will only go to VDD+0.7V when a particle strikes the space charge region.

Therefore, as can be seen, there must be a reverse biased condition in order for an SEU to occur.

A radiation particle moving along track #2 shown in FIG. 1 also creates hole-electron pairs along the track, and these hole-electron pairs can diffuse into the depletion region. However, the diffusion process is much slower than the drift process corresponding to particle track #1. Therefore, a smaller current corresponding to particle track #2 is created compared to the current corresponding to particle track #1. Therefore, SEUs are created primarily by particles passing through the depletion region. As a result, the depletion region defines the sensitive volume for an SEU. (The sensitive volume for charge collection is the region from which a node collects charge.)

In bulk silicon technology, the depletion region of a node is principally the region under the drain. Therefore, the sensitive volume is also principally the region under the drain. There also are depletion regions surrounding the drain and under the gate, but these regions are generally small compared to the region under the drain. Therefore, the sensitive volume in bulk silicon technology is the drain region.

In SOI (Silicon On Insulator) technology, there is no depletion region under the drain. There is a depletion region under the gate, and there may or may not be a depletion region around the remaining sides of the drain. Therefore, the sensitive volume in SOI technology is generally the gate region, but may also include some additional perimeter of the drain.

FIG. 2 shows an off SOI n-channel transistor 14 with a particle track #1 passing through a depletion region 16 under the gate of the SOI n-channel transistor 14 and a particle track #2 passing through a drain perimeter depletion region 18 extending out from the non-gate perimeter of the drain of the SOI n-channel transistor 14. Both of these tracks introduce charge to the V+ node in the same manner as described above.

In addition, SOI devices are especially vulnerable to an additional current flow mechanism that can be triggered by a particle. This additional flow mechanism can be understood with reference to FIG. 2. Particle track #1 shown in FIG. 2 passes through the silicon region under the gate (i.e., transistor substrate node) of the SOI n-channel transistor 14. The depletion region 16 moves electrons to the drain N+ region and holes oppositely into the P− region under the gate. The V+ node collects the electrons, but the holes continue to collect in the P− region under the gate. This hole collection raises the P− voltage until a pn junction forward bias occurs with the source region.

Moreover, the MOSFET source/substrate/drain structure is also a parasitic NPN bipolar structure, where the source is the emitter of the bipolar structure, where the substrate is the base of the bipolar structure, where the drain is the collector of the bipolar structure, and where the base/emitter junction is forward biased by the collection of charge as described above. This forward biasing creates a collector current that is equal to the base current (which is created by the charge deposited by a particle strike) times the gain of the parasitic bipolar transistor (parasitic BJT). Accordingly, the drain current is greater than can be directly attributed to the hole-electron pairs generated by the particle.

This additional current flow must be avoided in order to avoid an upset. Therefore, it is important to sweep the accumulating holes in the P− region out directly to the ground node as shown in FIG. 3. However, even in this case, there is a resistance associated with the P− region such that the resulting IR drop could still result in a forward bias of the substrate/source junction.

FIG. 3 is a top view of the transistor shown in FIG. 2. As shown in FIG. 3, the P− substrate is coupled directly to ground. Arrows show the resulting hole-electron movement. However, there is resistance in the P− substrate region through which the holes move that will create an IR drop. This resistance must be kept low enough to prevent the IR drop from forward biasing the substrate/source junction.

SEU hardening of integrated circuit has been implemented to prevent single event upset Generally, two methods have been used to implement SEU hardening of data storage circuits (i.e. memory cells, latches, flip-flops, registers, etc.). In the first method, logic is added to the integrated circuit. However, this first method has significantly increased area, delay, and power.

In the second method, RC delay (usually involving one or two resistors whose resistance is in the neighborhood of 10,000 ohms to more than 100,000 ohms) has been added to the feedback path in the integrated circuit. However, the second method places a large RC delay in the write path of the integrated circuit, thereby increasing delay. The second method also requires additional processing for the dedicated resistive element(s).

U.S. patent application Ser. No. 10/034,808, in addition to disclosing further prior art SEU hardening circuits, discloses several innovative SEU hardening circuits that avoid many instances of single event upsets. For example, FIG. 4 is from the '808 application and illustrates a positive-level-sensitive D latch 22 (i.e., the latch 22 is transparent when CLK=H), and FIG. 5 is from the '808 application and illustrates a pull up SEU hardening circuit 24 that can be used to SEU harden the positive-level-sensitive D latch 22. The latch 22 and the pull up SEU hardening circuit 24 are coupled together through nodes Q and QN. Although the pull up SEU hardening circuit 24 as shown in FIG. 4 is to be used with the latch 22, it should be understood that the pull up SEU hardening circuit 24 can also be used with other types of storage elements such as a master or slave of a flip-flop, a memory cell, a register, etc.

During a stored data state when the latch 22 is closed (CLK=L), the nodes Q and QN are actively driven by circuits 26 and 28 and by the pull up SEU hardening circuit 24. In a stored data state, the regions that are vulnerable to a particle strike that can cause a SEU are the reverse biased pn junction regions around sources and drains or under gates that result in a current path between the nodes Q and QN and the source VDD or VSS. For example, if Q=H and QN=L, then there is a reverse biased pn junction around the drain and under the gate of a transistor 66 which, if struck by a particle, results in a current flow from the node Q to VSS that tries to discharge the node Q to VSS (i.e., to Q=L). If the discharging current is greater than the holding current provided by transistor 50, then an upset will occur.

The amount of discharge current created by the particle is proportional to the mass and energy of the particle and the gain of the parasitic BJT, and is inversely proportional to the impedance between the struck region and the node Q and between the struck region and VSS. The amount of holding current is proportional to the width/length (W/L) of the transistors providing the holding current. Thus, SEU hardness (i.e., immunity) is enhanced by reducing the discharge current and/or increasing the holding current. Even if the original data state stored in the latch 22 is upset, SEU hardness is enhanced if the pre-SEU data state is maintained in the pull up SEU hardening circuit 24 and if, after the charge collection time from the particle ends, the maintained pre-SEU data state holding current from the on hardened p-channel transistor 46 or 56 in the pull up SEU hardening circuit 24 can overdrive the holding current of the upset data state in the latch 22 and impose the pre-SEU data state back onto the latch 22.

The pull up SEU hardening circuit 24 shown in FIG. 5 makes the nodes Q and QN more immune to SEUs from particles by increasing the holding current and/or by maintaining the pre-SEU data state and imposing this state back onto the latch 22. The pull up SEU hardening circuit 24 works as described immediately below.

When the node Q is in a high state and the node QN is in a low state (CLK=L), n-channel transistors 30 and 32 and a p-channel transistor 38 of a gate control circuit 40 are on, driving a node 42 to a low state to thereby turn p-channel transistors 44 and 46 on. N-channel transistors 34 and 36 and a p-channel transistor 58 of a gate control circuit 68 are off. Therefore, the p-channel transistor 44 drives the node 52 to a high state thereby turning off the p-channel transistors 54 and 56. The p-channel hardening transistor 46 provides drive to the node Q from VDD which connects to the node Q of the latch 22 in FIG. 4 and, therefore, supplements the holding current provided by the p-channel transistor 50 of the circuit 28 from VDD.

If the holding current is insufficient and the SEU event causes the node Q to go to a low state and causes the node QN to go to a high state, then the gate control circuit 40 turns off and the gate control circuit 68 turns on in the pull up SEU hardening circuit 24. If the drive of the gate control circuit 68 in series with the CLK driver is sufficiently small compared to the drive of the transistor 44 such that the voltage of the node 52 does not fall enough to turn the transistor 54 on, then the p-channel transistors 44 and 46 remain on since there is no pull up drive on the node 42. Thus, the original states of the p-channel transistors 46 and 56 are maintained, and the pre-SEU data state is stored in the pull up SEU hardening circuit 24. Once the particle charge collection time has ended, the drive of the on p-channel transistor 46 overdrives the on transistor 66 in the latch 22 to return Q to a high state, such that the pre-SEU data state that was stored in the pull up SEU hardening circuit 24 is returned to the latch 22.

It should be noted that, if the drive provided by the gate control circuit 68 in series with the CLK driver is not sufficiently small compared to the drive provided by the transistor 44, the voltage of the node 52 does fall enough to turn the transistor 54 on. As a result, the p-channel transistors 54 and 56 will turn on and the node 42 will go high thereby turning off the p-channel transistors 44 and 46 resulting in a state that reinforces the upset data state of the latch 22. However, it takes time for these state changes on the p-channel transistors 46 and 56 to complete. If, at the time the particle charge collection is finished, the p-channel transistors 44 and 46 on drive is greater than the p-channel transistors 54 and 56 on drive, and if the on drive of the p-channel transistors 44 and 46 is still sufficient to overdrive the on transistor 66 in the latch 22 to return the node Q to a high state, then the pre-SEU data state that was stored in the pull up SEU hardening circuit 24 is returned to the latch 22 and the transitioning in the pull up SEU hardening circuit 24 from the pre-SEU data to the upset data state is halted and then reversed.

When the node Q is in a low state and the node QN is in a high state (CLK=L), a p-channel transistor 58 and the n-channel transistors 34 and 36 of the gate control circuit 68 are on thereby driving the node 52 to a low state, which turns on the p-channel transistors 54 and 56. The n-channel transistors 30 and 32 and the p-channel transistor 38 of the gate control circuit 40 are off. Therefore, the transistor 54 drives the node 42 to a high state to thereby turn off the p-channel transistors 44 and 46. The p-channel hardening transistor 56 provides drive to the node QN from VDD and, therefore, supplements the holding current from VDD provided to the node QN by series coupled p-channel transistors 60 and 62 of the circuit 26.

If the holding current is insufficient and the SEU event causes the node Q to go to a high state and causes the node QN to go to a low state, then the gate control circuit 68 turns off and the gate control circuit 40 turns on in the pull up SEU hardening circuit 24. If the drive of the gate control circuit 40 in series with the CLK driver is sufficiently small compared to the drive of the transistor 54, the voltage of the node 42 does not fall enough to turn the transistor 44 on. As a result, the p-channel transistors 54 and 56 remain on since there is no pull up drive on the node 52. Thus, the original states of the p-channel transistors 46 and 56 are maintained. Once the particle charge collection time has ended, the pre-SEU data state that was stored in the pull up SEU hardening circuit 24 is returned to the latch 22 if the drive of the on p-channel transistor 56 can overdrive the on transistors 64 and 74 in the latch 22 to return the node QN to a high state.

It should be noted that, if the drive of the gate control circuit 40 in series with the CLK driver is not sufficiently small compared to the drive of the transistor 54, the voltage of the node 42 does fall enough to turn the transistor 44 on. As a result, the p-channel transistors 44 and 46 will turn on and the node 52 will go to a high state thereby turning off the p-channel transistors 54 and 56 resulting in a state that reinforces the upset data state of the latch 22. However, it takes time for these state changes on the p-channel transistors 46 and 56 to complete. If, at the time the particle charge collection is finished, the p-channel transistors 54 and 56 on drive is greater than the p-channel transistors 44 and 46 on drive, and if the on drive of the p-channel transistors 54 and 56 is still sufficient to overdrive the on transistor 64 in the latch 22 to return the node QN to a high state, then the pre-SEU data state that was stored in the pull up SEU hardening circuit 24 is returned to the latch 22 and the transitioning in the pull up SEU hardening circuit 24 from the pre-SEU data to the upset data state is halted and then reversed.

When the latch 22 is transparent (i.e., CLK=H), the CLK=L to CLK=H state change passes through whichever of the gates 40 and 68 is on if the pull up SEU hardening circuit 24 is on, and turns off whichever of the p-channel transistors 44 and 54 is on. The net result is that both of the p-channel hardening transistors 46 and 56 will be off. Therefore, the node Q will be set to the level on the data line DATA, and the node QN will be set to the logical not of the data on the data line DATA unhindered by the pull up SEU hardening circuit 24.

To tolerate a large amount of deposited charge on the node Q or on the node QN (i.e., to increase Qcrit on the node Q or on the node QN) in a stored data state, the widths (i.e., drive) of the p-channel transistors 50, 60, and 62 and n-channel 64, 66, and 74 and the widths of the p-channel transistors 46 and 56 may be set large enough to provide a drive strength sufficient to overcome the current created by the deposited charge. Since the SER (soft error rate) is inversely proportional to Qcrit, the SER is inversely proportional to the width. The p-channel transistors 46 & 56 may also be set large enough to overcome the drive of the n-channel transistors 64, 66, and 74. Thus, the width is set according to the desired SER level.

Also, the maximum drive of the clock CLK used to drive the latch 22 must be taken into account in determining how large to make the widths of the p-channel transistors 44 and 54. The larger the clock drive, the wider the width of these transistors should be in order to overcome the deposited charge on the node Q or the QN. The reason for this relationship is that a large clock drive in series with the gate control circuit 40 or the gate control circuit 68 of the pull up SEU hardening circuit 24 drives the node 42 or the node 52 to a low state faster than a small clock drive. Therefore, a deposited charge on the node Q or on the node QN can turn off the p-channel hardening transistor 46 or the p-channel hardening transistor 56 faster with a large clock drive than with a small clock drive.

For example, when the node QN is in a low state and CLK=L, a particle strike on the depletion region under the gate of the p-channel transistor 60 can charge the node QN to a high state that quickly forces the node Q to a low state. When the node QN is in a high state and the node Q is in a low state, the p-channel transistor 38 and the n-channel transistors 30 and 32 are off, and the p-channel transistor 58 and the n-channel transistors 34 and 36 are on. Accordingly, the node 52 discharges to a low state faster for a large clock drive than for a small clock drive.

When the node 52 is in a low state, the transistor 54 is on and drives the node 42 to a high state. When the node 42 is in a high state, the p-channel hardening transistor 46 is off such that the drive provided by the n-channel transistor 66 overcomes the drive provided by the p-channel transistor 50 to re-enforce the data state change on the node QN.

The widths of the n-channel transistors 64 and 66 and the widths of the p-channel transistors 46 and 56 can be increased to provide extra drive to the nodes Q and QN in order to overcome small deposited charges on the nodes Q and QN (i.e., increase Qcrit). Increasing the widths of the n-channel transistors 64 and 66 and the p-channel transistors 46 and 56 does not significantly affect circuit performance (e.g., clock power, Clock-Q timing, etc.) because these transistors are not in the direct path of the clock (or the gates of these transistors are not controlled by the clock). Since the SER is inversely proportional to Qcrit, the SER is inversely proportional to width. Thus, the width is set according to the desired SER level.

In addition, the strength of the drive provided by the gate control circuit 40 to the p-channel transistor 54, and the strength of the drive provided by the gate control circuit 68 to the p-channel transistor 44 are important because they control how fast the p-channel hardening transistors 46 and 56 can switch. These drive strengths must be small enough that they can switch the p-channel hardening transistors 46 and 56 within the operating frequency, but not so large as to quickly turn off the p-channel hardening transistors 46 and 56 as a result of a small SEU particle striking the node Q or the node QN.

Furthermore, the layout separation between the n-channel transistors 30 and 32 and between the n-channel transistors 34 and 36 should be large enough such that the probability of a particle simultaneously striking the depletion regions under both gates of the n-channel transistors 30 and 32 and/or under both gates of the n-channel transistors 34 and 36 is less than the desired SER.

The substrate and source regions of each of the n-channel transistors 30, 32, 34, and 36 can be coupled together (the source region is the side closest to the CLK node), or the substrates of the n-channel transistors 30, 32, 34, and 36 can be coupled to VSS (the traditional coupling of the substrates of n-channel transistors), or the substrates of the n-channel transistors 30, 32, 34, and 36 can be left floating.

The SEU hardening and operation of the pull up SEU hardening circuit 24 is similar between the substrate to source region connection case and the floating substrate case. Accordingly, only the substrate to source region connection case is discussed in detail herein. When the n-channel transistors 30 and 32 are off, the node QN is in a high state, the node Q is in a low state, the node 52 is in a low state, the node 42 is in a high state, and a node 70 is in a capacitance high state (VDD−Vthnmos, where Vthnmos is the threshold voltage of an n-channel transistor). A particle striking the depletion region under the gate of the n-channel transistor 30 can discharge the node 70 to a low state because CLK=L. But, because the n-channel transistor 32 and p-channel transistor 38 remains off, there is no change in the state at the node 42 and, consequently, no change in the stored data state.

Similarly, a particle striking the depletion region under the gate of the n-channel transistor 32 under the same conditions (except that the node 70 is now in a capacitance low state) creates a current path between nodes 70 and 42. But, because the n-channel transistor 30 remains off, there is no current path from the node 70 to CLK. Thus, there is no change in the state at the node 42 and, consequently, no change in the stored data state assuming the capacitance of node 70 is much less than the capacitance of node 42. The p-channel transistor 54 does not have any reverse biased pn junction connected to the node 42. Therefore, a particle strike on this transistor will not cause a state change on the node 42. The p-channel transistor 44 does have reverse biased pn junctions connected to the node 52. Therefore, a particle strike on this transistor will cause a state change on the node 42. Particle strikes on the transistors 44 and 58 that cause a low to high state change on the node 52 will only turn the transistors 54 and 56 off, and no transistors turn on. Since this state change does not disturb the stored data state in the latch 22, after the charge collection time is ended, the node 52 returns to its original state. Due to circuit symmetry, when the node Q is high and the node QN is low, the complement of the above description occurs.

An advantage of the substrate to source region coupling case over the substrate floating case is that the n-channel transistors 30, 32, 34, and 36 switch faster in the substrate to source region connection case than in the substrate floating case. The reason for this faster switching is that there is no difference in the source-to-substrate voltages (e.g., Vsb for the n-channel transistor 30=Vsb for the n-channel transistor 32=Vsb for the n-channel transistor 34=Vsb for the n-channel transistor 36=0). Thus, the depletion-layer width remains constant for the substrate to source region connection case, thereby minimizing body-effect on the threshold voltage.

The faster the n-channel transistors 30, 32, 34, and 36 can switch for a small width without increasing the SER, the faster the p-channel hardening transistors 46 and 56 switch within the operating frequency. Therefore, connecting each of the substrates of the n-channel transistors 30, 32, 34, and 36 to its corresponding source region is a preferred option for SEU hardening and circuit speed.

However, leaving the substrates of the n-channel transistors 30, 32, 34, and 36 floating does provide the same level of SEU hardening to the data storage element. It should be noted that the floating substrate case is easy to implement in SOI technology but is much more difficult to accomplish in bulk silicon technology because generally either of the p- and n-channel transistors share a common n/p-type chip substrate.

As mentioned above, the substrates of the n-channel transistors 30, 32, 34, and 36 could be connected to VSS. However, this connection results in a sensitive volume (i.e., reverse biased pn junction) being present on the node 42 when it is high or on the node 52 when it is high. The SEU analysis is similar for the sensitive volume on the nodes 42 and 52, so the SEU analysis will be discussed in detail only for the sensitive volume on the node 42.

When the n-channel transistors 30 and 32 are off, the node QN is in a high state, the node Q is in a low state, the node 70 is in a capacitance high state (VDD–Vthnmos), the node 42 is in a high state, and the pn junction formed between the node 42 and the substrate of the n-channel transistor 32 (the substrate of the n-channel transistor 32 is at VSS) is reverse biased. The resulting depletion region creates a sensitive volume on the node 42 and a particle strike through this depletion region causes the node 42 to discharge to a low state.

When the node 42 is in a low state, the p-channel transistors 44 and 46 turn on, charging the node 52 and the node Q to a high state. When the node 52 is in a high state, the p-channel transistors 54 and 56 (the p-channel transistor 56 is the hardening transistor for the node QN) turn off. The high state on the node Q turns on the n-channel transistor 64, overcoming the p-channel transistors 60 and 62 and driving the node QN to a low state. So, a particle striking the node 42 can turn off the p-channel hardening transistor 56, causing a data state change on the node Q that quickly causes a data state change on the node QN which reinforces the data state change on the node Q.

Therefore, connecting the substrate of the n-channel transistors 30, 32, 34, and 36 to VSS is not an ideal option for SEU hardening. But this option does provide some SEU hardening against particle strikes on the sensitive volume on the nodes Q and QN associated with the circuits 26 and 28. Thus, the pull up SEU hardening circuit 24 with the substrates of the n-channel transistors 30, 32, 34, and 36 connected to VSS can reduce the net SER because the number of sensitive volumes is reduced and the total SER is the sum of the SERs on all sensitive volumes in the data storage loop.

FIGS. 6 and 7 are also from the '808 application. FIG. 6 illustrates a negative-level-sensitive D latch 122 (i.e., the latch is transparent when CLK=L), and FIG. 7 illustrates a pull down SEU hardening circuit 124 that can be used to SEU harden the negative-level-sensitive D latch 122. The latch 122 and the pull down SEU hardening circuit 124 are coupled together through the nodes Q and QN. As before, the latch 122 can be other types of storage elements such as a master or slave of a flip-flop, a memory cell, a register, etc.

The latch 122 includes p-channel transistors 126, 128, 130, 132, and 140 and n-channel transistors 134, 136, 138, 142, and 144. The pull down SEU hardening circuit 124 includes p-channel transistors 150 and 152 and an n-channel transistor 154 forming a gate control circuit 156, p-channel transistors 158 and 160 and an n-channel transistor 162 forming a gate control circuit 164, and n-channel transistors 166, 168, 170, and 172.

The SEU hardening and operation of the pull down SEU hardening circuit 124 shown in FIG. 7 is not discussed in detail herein because the pull down SEU hardening circuit 124 is similar to the pull up SEU hardening circuit 24 used with the positive-level-sensitive D latch 22, which has been discussed in detail above.

Although the pull up SEU hardening circuit 24 and the pull down SEU hardening circuit 124 as described above work well under most conditions, each of these hardening circuits has a node that is susceptible to a single event upset. Accordingly, a particle having relatively low energy can cause a single event upset. These nodes are discussed below in the detailed description.

Moreover, the nodes 42, 52, 202, and 204 of these hardening circuits are undriven nodes that drive corresponding hardening transistors. Accordingly, the undriven nodes can float. If the undriven nodes float to the wrong state, the hardening circuit will sink DC current. This current sinking has the potential to be a standby current/power issue for ASICs with large numbers of hardening circuits.

The present invention overcomes one or more of these or other problems.

SUMMARY OF THE INVENTION

In accordance with one aspect of the present invention, a hardening system comprises a data storage device and a hardening circuit, and the hardening circuit comprises first, second, third, fourth, and fifth transistor circuits. The data storage device has a data input, a clock input, and a data state reinforcing feedback path having a data node Q and a data complement node QN. The data storage device provides drive to the data node Q and the data complement node QN. The hardening circuit is coupled to the data state reinforcing feedback path. The first and second transistor circuits form a first node therebetween, and the first transistor circuit is coupled to the data node Q so as to prevent the data node Q from changing states in the presence of radiation. The third and fourth transistor circuits form a second node therebetween, and the third transistor circuit is coupled to the data complement node QN so as to prevent the data complement node QN from changing states in the presence of radiation. The first node is coupled to the third transistor circuit, and the second node is coupled to the first transistor circuit. The fifth transistor circuit is coupled to the first and second nodes so as to prevent the first and second nodes from floating.

In accordance with another aspect of the present invention, a hardening circuit for an integrated circuit having a data state reinforcing feedback path with a data node Q and a data complement node QN comprises first and second hardening transistors, first and second gate control circuits, and a transistor circuit. The first hardening transistor is coupled between a rail and the data node Q, and the first hardening transistor provides additional drive to the data node Q. The second hardening transistor is coupled between the rail and the data complement node QN, and the second hardening transistor provides additional drive to the data complement node QN. The first gate control circuit is coupled between a clock input and a gate of the second hardening transistor, the first gate control circuit has a control input, the control input is coupled to the data complement node QN, and the first gate control circuit includes a first node. The second gate control circuit is coupled between the clock input and a gate of the first hardening transistor, the second gate control circuit has a control input, the control input is coupled to the data node Q, and the second gate control circuit includes a second node. The transistor circuit is coupled to the first and second nodes so as to prevent the first and second nodes from floating.

In accordance with still another aspect of the present invention, a hardening system comprises a data storage device and a hardening circuit, and the hardening circuit comprises first, second, and third transistor circuits. The data storage device has a data input and a data output node, and the data storage device provides drive to the data output node. The hardening circuit is coupled to the data output node. The first and second transistor circuits form a node therebetween, and the first transistor circuit is coupled to the data node so as to prevent the data node from changing states in the presence of radiation. The third transistor circuit is coupled to the node so as to prevent the node from floating.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
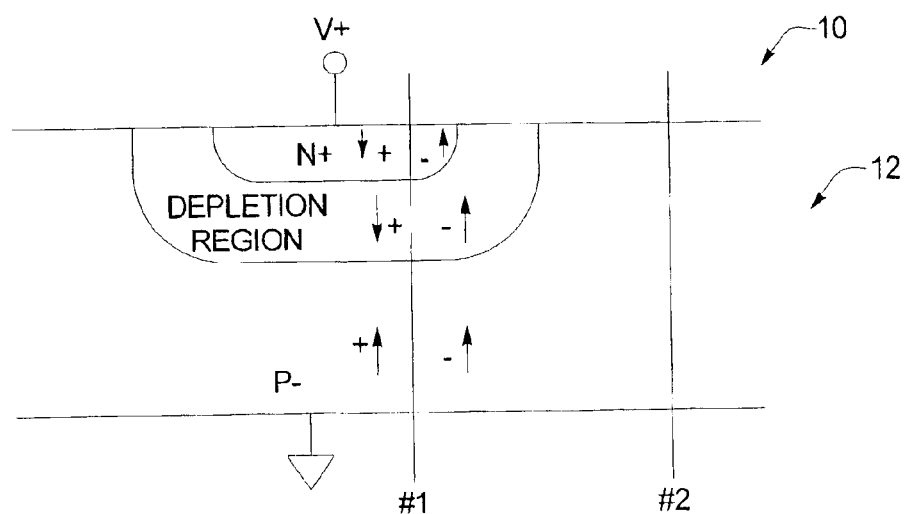
FIG. 1 illustrates movement through a reverse biased pn junction of the holes and electrons generated from a particle passing through the silicon of a transistor.
Figure 2:
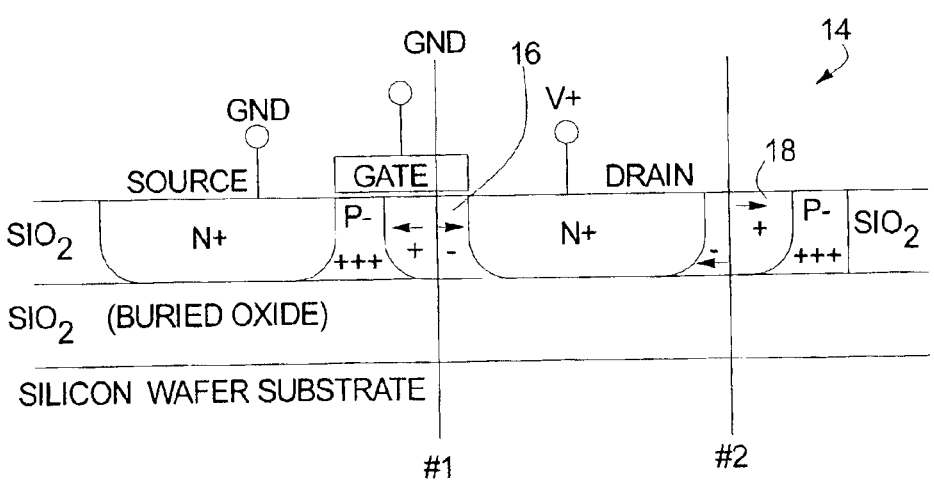
FIG. 2 shows a particle track #1 through a depletion region under the gate of an off SOI n-channel transistor and a particle track #2 through a depletion region at the non-gate perimeter of the drain of the off SOI n-channel transistor.
Figure 3:
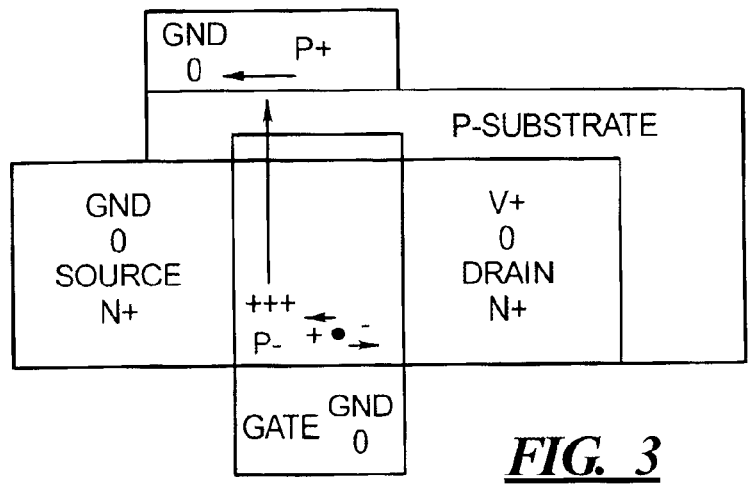
FIG. 3 is a top view of the transistor shown in FIG. 2.

The pull up SEU hardening circuit 24 as described above has a single event upset susceptibility during the time that the latch 22 is storing data. In the case of storing DATA=0 (Q=0, QN=1), the node 42 is held high by the p-channel transistor 54, and the node 52 is held low by the n-channel transistors 34 and 36. A single event upset particle strike to the p-channel transistor 38 can short the node 42 to CLK via the turning on of the parasitic bipolar described in FIG. 2. This was not recognized in the aforementioned application. Shorting of the node 42 to CLK turns on the p-channel transistor 46 which can upset the state of the latch 22.

Similarly, in the case of storing DATA=1(Q=1, QN=0), the node 52 is held high by the p-channel transistor 44, and the node 42 is held low by the n-channel transistors 30 and 32. A single event upset particle strike to the p-channel transistor 58 can short the node 52 to CLK via the turning on of the parasitic bipolar device described in FIG. 2. Shorting of the node 52 to CLK turns on the p-channel transistor 56 which can upset the state of the latch 22.

Figures 7, 8:
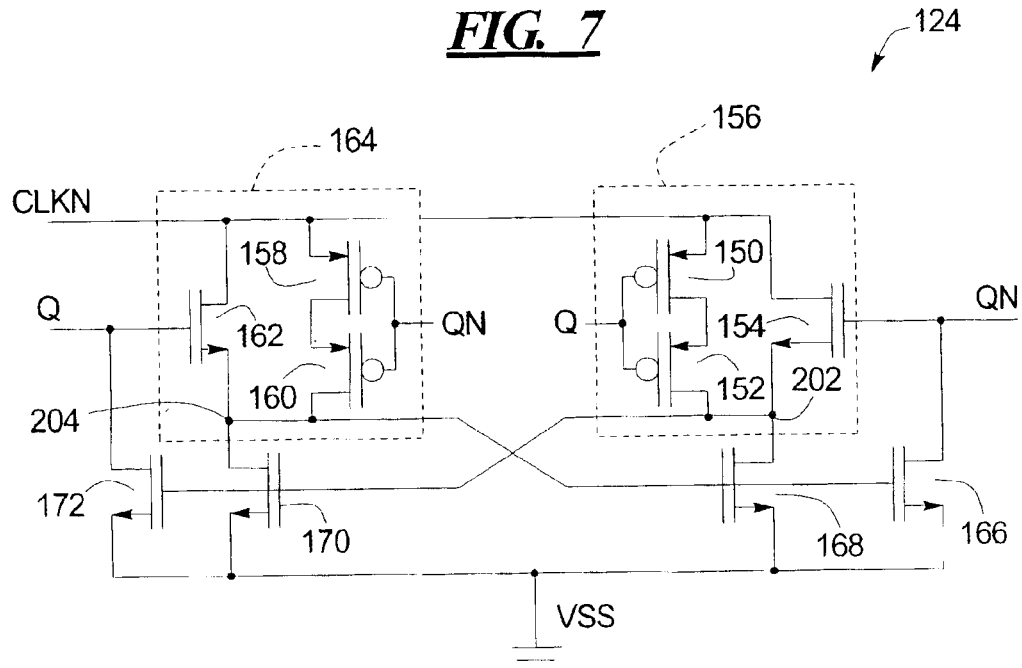
FIG. 7 shows a pull down SEU hardening circuit that can be used to SEU harden the negative-level-sensitive D latch of FIG. 6.
FIG. 8 shows a pull up SEU hardening circuit according to one embodiment of the present invention.

FIG. 8 shows a pull up SEU hardening circuit 300 in which the p-channel transistors 38 and 58 have been removed. The addition of p-channel transistors 302 and 304 permit the removal of the p-channel transistors 38 and 58. Except for the removal of the p-channel transistors 38 and 58 and the addition of the p-channel transistors 302 and 304, the pull up SEU hardening circuit 300 is the same as the pull up SEU hardening circuit 24 of FIG. 5. Accordingly, the devices that are common to both FIGS. 5 and 8 are assigned the same reference numerals herein.

Figure 5:
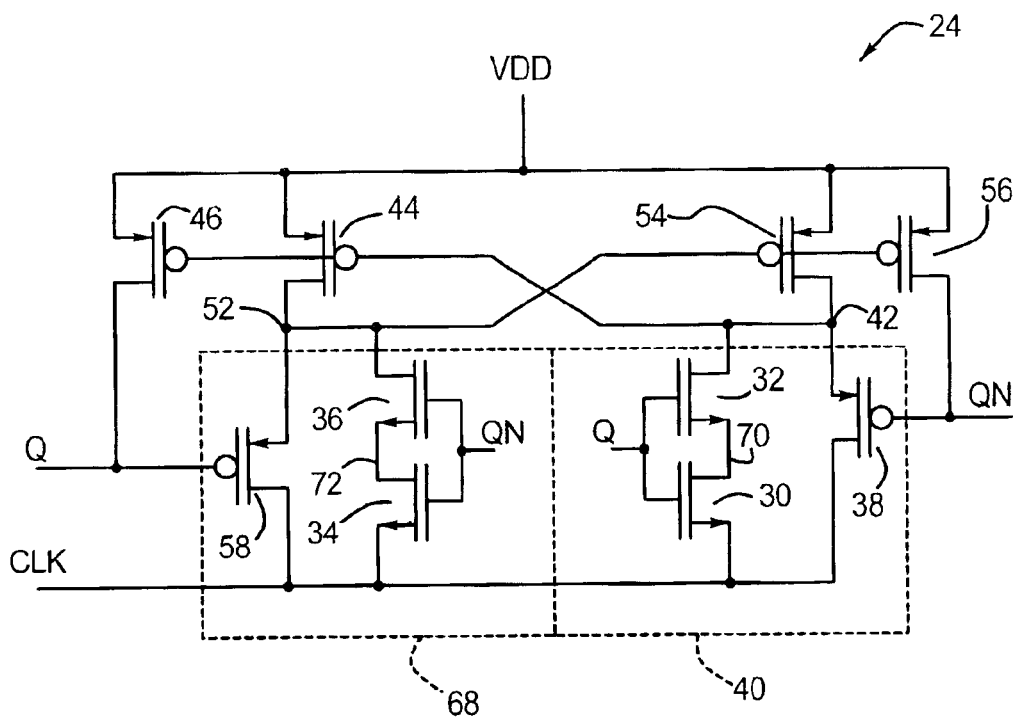
FIG. 5 shows a pull up SEU hardening circuit that can be used to SEU harden the positive-level-sensitive D latch of FIG. 4.
Figure 4:
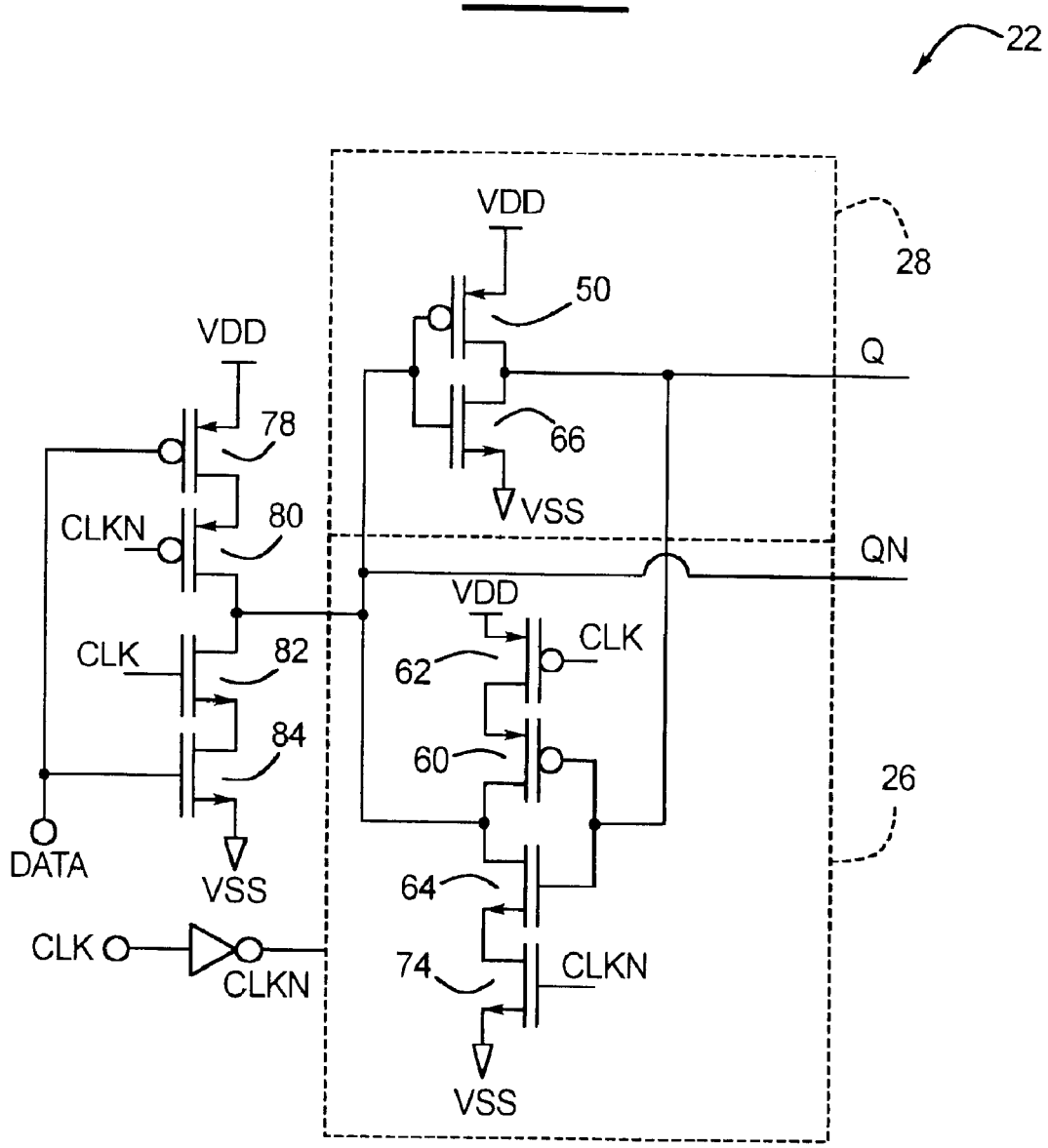
FIG. 4 shows a positive-level-sensitive D latch to be hardened by the present invention.

Moreover, when the latch 22 of FIG. 4 is loading data while CLK=1 and CLKN=0, the pull up hardening circuit 24 of FIG. 5 must provide no drive to Q and QN. In the case of loading DATA=1 (Q=1, QN=0), the node 42 is driven to a 1 state by the p-channel transistor 38. However, there is no drive to the node 52. Therefore, the node 52 floats. If the node 52 floats low toward a 0 state, the node 52 can turn on the p-channel transistors 54 and 56. The p-channel transistors 54 and 56, when on, resist the data state loading into the latch 22, and also provide a DC current path through the n-channel transistors 30 and 32 permitting increased power consumption and/or a drain of standby current.

Similarly, in the case of loading DATA=0 (Q=0, QN=1), the node 52 is driven to a 1 state by the p-channel transistor 58 of FIG. 5. However, there is no drive to the node 42. Therefore, the node 42 floats. If the node 42 floats low toward a 0 state, the node 42 can turn on the p-channel transistors 44 and 46. The p-channel transistors 44 and 46, when on, resist the data state loading into the latch 22, and also provide a DC current path through the n-channel transistors 30 and 32 permitting increased power consumption and/or a drain of standby current.

However, while CLK=1 and CLKN=0, the p-channel transistors 302 and 304 of the pull up hardening circuit 300 of FIG. 8 provide drive to the nodes 42 and 52. Accordingly, the p-channel transistors 302 and 304 pull up the nodes 42 and 52 so that the p-channel transistors 44, 46, 54, and 56 are off during data loading. Therefore, the nodes 42 and 52 do not float. Thus, the nodes 42 and 52 are prevented from turning on the p-channel transistors 44, 46, 54, and 56.

As can be seen from the above description, the addition of the p-channel transistors 302 and 304 make the p-channel transistors 38 and 58 of FIG. 5 unnecessary. Therefore, the pull up hardening circuit 300 as shown in FIG. 8 has no nodes susceptible to SEUs caused by particle strikes. Also, the addition of the p-channel transistors 302 and 304 prohibits floating nodes that can sink DC current.

When the latch 22 of FIG. 4 is storing data while CLK=0 and CLKN=1, the p-channel transistors 302 and 304 are both off, and the pull up SEU hardening circuit 300 operates in the same manner as that described above in connection with the pull up SEU hardening circuit 24.

An SEU hit to either transistor 302 or 304 results in either node 42 or 52 being pulled high. Pulling these nodes high only results in the p-channel SEU hardening transistors 46 or 56 turning off. Turning off these transistors will not result in a state upset of the storage element.

The pull down SEU hardening circuit 124 (FIG. 7) as described above has a single event upset susceptibility during the time that the latch 122 is storing data. In the case of storing DATA=0 (Q=0, QN=1), the node 204 is held low by the n-channel transistor 170, and the node 202 is held high by the p-channel transistors 150 and 152. A single event upset particle strike to the n-channel transistor 162 can short the node 204 to CLKN via the turning on of the parasitic bipolar transistor described in FIG. 2. Shorting of the node 204 to CLKN turns on the n-channel transistor 166 which can upset the state of the latch 22.

Similarly, in the case of storing DATA=1 (Q=1, QN=0), the node 202 is held low by the n-channel transistor 168, and the node 204 is held high by the p-channel transistors 158 and 160. A single event upset particle strike to the n-channel transistor 154 can short the node 202 to CLKN via the turning on of the parasitic bipolar transistor described in FIG. 2. Shorting of the node 202 to CLKN turns on the n-channel transistor 172 which can upset the state of the latch 22.

Figure 9:
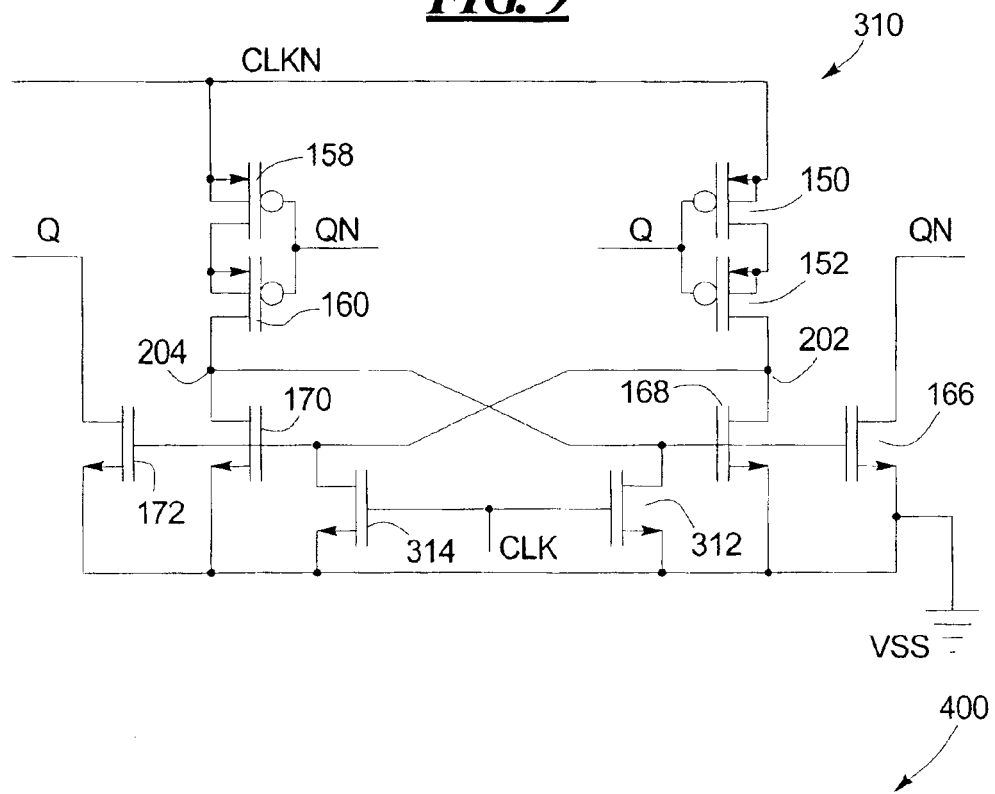
FIG. 9 shows a pull down SEU hardening circuit according to another embodiment of the present invention.

FIG. 9 shows a pull down SEU hardening circuit 310 in which the n-channel transistors 154 and 162 have been removed. The addition of n-channel transistors 312 and 314 permit the removal of the n-channel transistors 154 and 162. Except for the removal of the n-channel transistors 154 and 162 and the addition of the n-channel transistors 312 and 314, the pull down SEU hardening circuit 310 is the same as the pull down SEU hardening circuit 124 of FIG. 7. Accordingly, the devices that are common to both FIGS. 7 and 9 are assigned the same reference numerals herein.

Figure 6:
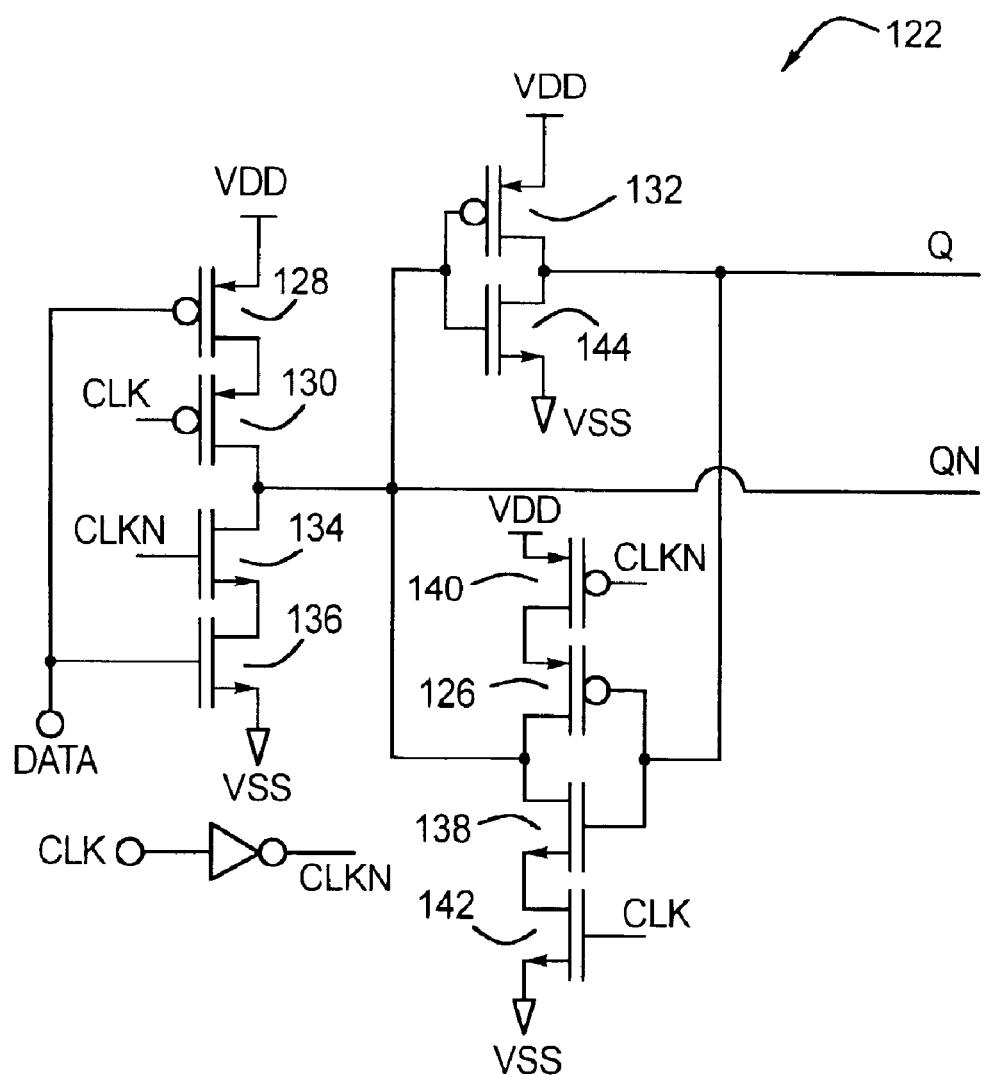
FIG. 6 shows a negative-level-sensitive D latch to be hardened by the present invention.

Moreover, when the latch 122 of FIG. 6 is loading data while CLK=1 and CLKN=0, the pull down hardening circuit 124 of FIG. 7 must provide no drive to Q and QN. In the case of loading DATA=1 (Q=1, QN=0), the node 204 is driven to a 0 state by the n-channel transistor 162. However, there is no drive to the node 202. Therefore, the node 202 floats. If the node 202 floats high toward a 1 state, the node 202 can turn on the n-channel transistors 170 and 172. The n-channel transistors 170 and 172, when on, resist the data state stored into the latch 122, and also provide a DC current path through the p-channel transistors 158 and 160 permitting increased power consumption and/or a drain of standby current.

Similarly, in the case of loading DATA=0 (Q=0, QN=1), the node 202 is driven to a 0 state by the n-channel transistor 154 of FIG. 7. However, there is no drive to the node 204. Therefore, the node 204 floats. If the node 204 floats high toward a 1 state, the node 204 can turn on the n-channel transistors 166 and 168. The n-channel transistors 166 and 168, when on, resist the data state loading into the latch 122, and also provide a DC current path through the p-channel transistors 150 and 152 permitting increased power consumption and/or a drain of standby current.

However, while CLK=1 and CLKN=0, the n-channel transistors 312 and 314 of the pull down hardening circuit 310 of FIG. 9 provide drive to the nodes 202 and 204. Accordingly, the n-channel transistors 312 and 314 pull down the nodes 202 and 204 so that the n-channel transistors 166, 168, 170, and 172 are off during data loading. Therefore, the nodes 202 and 204 do not float. Thus, the nodes 202 and 204 are prevented from turning on the n-channel transistors 166, 168, 170, and 172.

As can be seen from the above description, the addition of the n-channel transistors 312 and 314 make the n-channel transistors 154 and 162 of FIG. 7 unnecessary. Therefore, the pull down hardening circuit 310 as shown in FIG. 9 has no nodes susceptible to SEUs caused by particle strikes. Also, the addition of the p-channel transistors 312 and 314 prohibits floating nodes that can sink DC current.

When the latch 122 of FIG. 6 is storing data while CLK=0 and CLKN=1, the n-channel transistors 312 and 314 are both off, and the pull down SEU hardening circuit 310 operates in the same manner as that described above in connection with the pull down SEU hardening circuit 124.

An SEU hit to either transistor 314 or 312 results in either node 204 or 202 being pulled low. Pulling these nodes low only results in the n-channel SEU hardening transistors 172 or 166 turning off. Turning off these transistors will not result in a state upset of the storage element.

Figure 10:
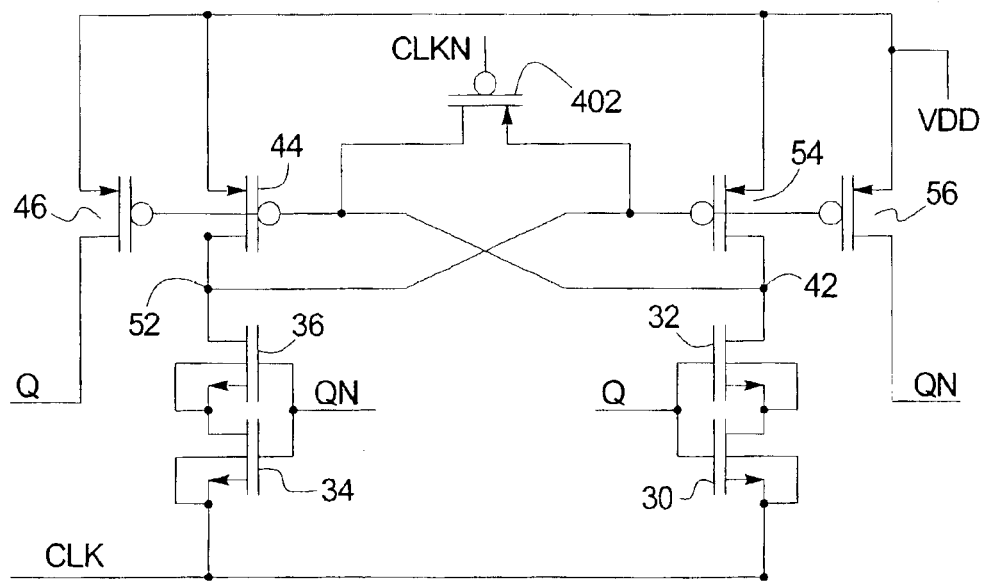
FIG. 10 shows a pull up SEU hardening circuit according to yet another embodiment of the present invention; and, FIG. 11 shows a pull down SEU hardening circuit according to still another embodiment of the present invention.

FIG. 10 shows a pull up SEU hardening circuit 400 as an alternative to the pull up SEU hardening circuit 300 of FIG. 8. When the latch 22 of FIG. 4 is loading data, the removal of the p-channel transistors 38 and 58 from the pull up SEU hardening circuit 24 of FIG. 5 means that the only high drive to the nodes 42 and 52 is through the on n-channel transistors 30 and 32 or 34 and 36. The on transistor 402 then passes the high state from the on stack to the off stack. The high state on CLK minus the threshold drop through the n-channel transistors 30 and 32 or 34 and 36 should be enough to turn off the p-channel transistors 46 and 56. However, this arrangement may not be optimal.

Alternatively, the p-channel transistors 38 and 58 need not be removed so that they can supply the necessary drive to turn off the p-channel transistors 46 and 56. However, the p-channel transistors 38 and 58 are susceptible to single event upsets as described above.

As a still further alternative, two series connected p-channel transistors with their bodies tied to their sources could be used in place of each of the p-channel transistors 38 and 58. This arrangement would eliminate the susceptibility to single event upsets. However, the resulting circuit would be larger than the pull up SEU hardening circuit 300 of FIG. 8.

The addition of a p-channel transistor 402 as shown in FIG. 10 eliminates the floating nodes that are a problem in the pull up SEU hardening circuit 24 of FIG. 5.

Also, the p-channel transistor 402 is susceptible to a single event upset. That is, a particle strike to the p-channel transistor 402 during data storage could turn on a parasitic BJT which will equalize the voltage on the nodes 42 and 52. When the nodes 42 and 52 are equalizing, the p-channel transistors 46 and 56 will turn on which has the potential to upset the circuit. However, the addition of the p-channel transistor 402 and the removal of the p-channel transistors 38 and 58 does reduce the number of susceptible transistors by one.

Figure 11:
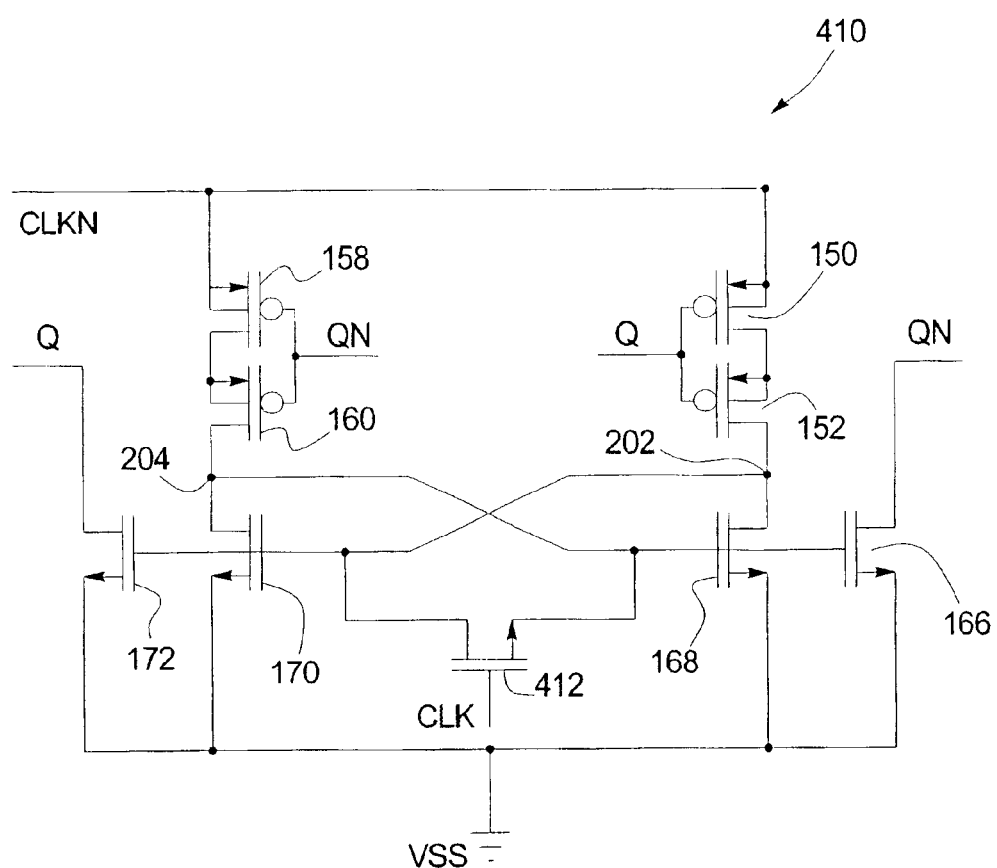

FIG. 11 shows a pull down SEU hardening circuit 410 as an alternative to the pull down SEU hardening circuit 310 of FIG. 9. When the latch 122 of FIG. 6 is loading data, the removal of the p-channel transistors 154 and 162 from the pull down SEU hardening circuit 124 of FIG. 7 means that the only low drive to the nodes 202 and 204 is through the p-channel transistors 150 and 152, or 158 and 160. The on transistor 412 then passes the low state from the on stack to the off stack. The low state on CLKN plus the threshold drop through the p-channel transistors 150 and 152 or 158 and 160 should be enough to turn off the n-channel transistors 166 and 172. However, this arrangement may not be optimal.

Alternatively, the n-channel transistors 154 and 162 need not be removed so that they can supply the necessary drive to turn off the n-channel transistors 166 and 172. However, the n-channel transistors 154 and 162 are susceptible to single event upsets as described above.

As a still further alternative, two series connected n-channel transistors with their bodies tied to their sources could be used in place of each of the n-channel transistors 154 and 162. This arrangement would eliminate the susceptibility to single event upsets. However, the resulting circuit would be larger than the pull down SEU hardening circuit 310 of FIG. 9.

The addition of an n-channel transistor 412 as shown in FIG. 11 eliminates the floating nodes that are a problem in the pull down SEU hardening circuit 124 of FIG. 7.

Also, the n-channel transistor 412 is susceptible to a single event upset. That is, a particle strike to the n-channel transistor 412 during data storage could turn on a parasitic BJT which will equalize the voltage on the nodes 202 and 204. When the nodes 202 and 204 are equalizing, the n-channel transistors 166 and 172 will turn on which has the potential to upset the circuit. However, the addition of the n-channel transistor 412 and the removal of the n-channel transistors 154 and 162 does reduce the number of susceptible transistors by one.

In FIGS. 8 and 10, the n-channel transistors 30 and 32 form a gate control circuit for the p-channel transistors 44 and 46, and the n-channel transistors 34 and 36 form a gate control circuit for the p-channel transistors 54 and 56. Similarly, in FIGS. 9 and 11, the p-channel transistors 150 and 152 form a gate control circuit for the n-channel transistors 170 and 172, and the p-channel transistors 158 and 160 form a gate control circuit for the n-channel transistors 166 and 168.

Certain modifications of the present invention will occur to those practicing in the art of the present invention. For example, although the hardening circuits 300 and 400 of FIGS. 8 and 10 have been described above for use with the latch 22 of FIG. 4, it should be noted that the hardening circuits 300 and 400 could instead be used with the latch 122 of FIG. 6 by inverting the clock input to the hardening circuits 300 and 400. Similarly, the hardening circuits 310 and 410 of FIGS. 9 and 11 can instead be used with the latch 22 of FIG. 4 by inverting the clock input to the hardening circuits 310 and 410.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A hardening system comprising:
   a data storage device having a data input, a clock input, and a data state reinforcing feedback path having a data node Q and a data complement node QN, wherein the data storage device is arranged to provide drive to the data node Q and the data complement node QN; and,
   a hardening circuit coupled to the data state reinforcing feedback path, wherein the hardening circuit comprises first and second transistor circuits forming a first node therebetween, wherein the first transistor circuit is coupled to the data node Q so as to prevent the data node Q from changing states in the presence of radiation,
   third and fourth transistor circuits forming a second node therebetween, wherein the third transistor circuit is coupled to the data complement node QN so as to prevent the data complement node QN from changing states in the presence of radiation, wherein the first node is coupled to the third transistor circuit, and wherein the second node is coupled to the first transistor circuit, and
   a fifth transistor circuit coupled to the first and second nodes so as to prevent the first and second nodes from floating.

2. The hardening system of claim 1 wherein the first transistor circuit comprises a first transistor, wherein the second transistor circuit comprises second and third transistors, wherein the third transistor circuit comprises a fourth transistor, wherein the fourth transistor circuit comprises fifth and sixth transistors, and wherein the fifth transistor circuit comprises a seventh transistor.

3. The hardening system of claim 2 wherein the first transistor, the second transistor, and the third transistor are coupled in series between first and second terminals, wherein the fourth transistor, the fifth transistor, and the sixth transistor are coupled in series between the first and second terminals, wherein the first node is between the first and second transistors, and wherein the second node is between the fourth and fifth transistors.

4. The hardening system of claim 3 wherein a gate of the first transistor is coupled to the second node, wherein gates of the second and third transistors are coupled to the data complement node QN, wherein a gate of the fourth transistor is coupled to the first node, and wherein gates of the fifth and sixth transistors are coupled to the data node Q.

5. The hardening system of claim 4 wherein a gate of the seventh transistor is coupled to a complement of one of the first and second terminals.

6. The hardening system of claim 5 wherein the first, fourth, and seventh transistors comprise corresponding p-channel transistors, and wherein the second, third, fifth, and sixth transistors comprise corresponding n-channel transistors.

7. The hardening system of claim 5 wherein the first, fourth, and seventh transistors comprise corresponding n-channel transistors, and wherein the second, third, fifth, and sixth transistors comprise corresponding p-channel transistors.

8. The hardening system of claim 1 wherein the first transistor circuit comprises first transistor, wherein the second transistor circuit comprises second and third transistors, wherein the third transistor circuit comprises a fourth transistor, wherein the fourth transistor circuit comprises fifth and sixth transistors, wherein the fifth transistor circuit comprises seventh and eighth transistors, wherein the seventh transistor is coupled to the first node, and wherein the eighth transistor is coupled to the second node.

9. The hardening system of claim 8 wherein the first transistor, the second transistor, and the third transistor are coupled in series between first and second terminals, wherein the fourth transistor, the fifth transistor, and the sixth transistor are coupled in series between the first and second terminals wherein the first node is between the first and second transistors, and wherein the second node is between the fourth and fifth transistors.

10. The hardening system of claim 9 wherein a gate of the first transistor is coupled to the second node, wherein gates of the second and third transistors are coupled to the data complement node QN, wherein a gate of the fourth transistor is coupled to the first node, and wherein gates of the fifth and sixth transistors are coupled to the data node Q.

11. The hardening system of claim 10 wherein gates of the seventh and eight transistors are coupled to a complement of one of the first and second terminals.

12. The hardening system of claim 11 wherein the first, fourth, seventh, and eighth transistors comprise corresponding p-channel transistors, and wherein the second, third, fifth, and sixth transistors comprise corresponding n-channel transistors.

13. The hardening system of claim 11 wherein the first, fourth, seventh, and eighth transistors comprise corresponding n-channel transistors, and wherein the second, third, fifth, and sixth transistors comprise corresponding p-channel transistors.

14. The hardening system of claim 1 wherein the first transistor circuit comprises first and second transistors, wherein the second transistor circuit comprises third and fourth transistors, wherein the third transistor circuit comprises fifth and sixth transistors, wherein the fourth transistor circuit comprises seventh and eighth transistors, and wherein the fifth transistor circuit comprises a ninth transistor.

15. The hardening system of claim 14 wherein the first transistor, the third transistor, and the fourth transistor are coupled in series between first and second terminals, wherein the fifth transistor, the seventh transistor, and the eighth transistor are coupled in series between the first and second terminals, wherein the first node is between the first and third transistors, and wherein the second node is between the fifth and seventh transistors.

16. The hardening system of claim 15 wherein a gate of the first transistor is coupled to the second node, wherein the second transistor is coupled to the data node Q, wherein gates of the third and fourth transistors are coupled to the data complement node QN, wherein a gate of the fifth transistor is coupled to the first node, wherein the sixth transistor is coupled to the data complement node QN, and wherein gates of the seventh and eighth transistors are coupled to the data node Q.

17. The hardening system of claim 16 wherein a gate of the ninth transistor is coupled to a complement of one of the first and second terminals.

18. The hardening system of claim 17 wherein the first, second, fifth, sixth, an ninth transistors comprise corresponding p-channel transistors, and wherein the third, fourth, seventh, and eighth transistors comprise corresponding n-channel transistors.

19. The hardening system of claim 17 wherein the first, second, fifth, sixth, and ninth transistors comprise corresponding n-channel transistors, and wherein the third, fourth, seventh, and eighth transistors comprise corresponding p-channel transistors.

20. The hardening system of claim 1 wherein the first transistor circuit comprise first and second transistors, wherein the second transistor circuit comprises third and fourth transistors, wherein the third transistor circuit comprises fifth and sixth transistors, wherein the fourth transistor circuit comprises seventh and eighth transistors, wherein the fifth transistor circuit comprises ninth and tenth transistors, wherein the ninth transistor is coupled to the first node, and wherein the tenth transistor is coupled to the second node.

21. The hardening system of claim 20 wherein the first transistor, the third transistor, and the fourth transistor are coupled in series between first and second terminals, wherein the fifth transistor, the seventh transistor, and the eighth transistor are coupled in series between the first and second terminals, wherein the first node is between the first and third transistors, and wherein the second node is between the fifth and seventh transistors.

22. The hardening system of claim 21 wherein a gate of the first transistor is coupled to the second node, wherein the second transistor is coupled to the data node Q, wherein gates of the third and fourth transistors are coupled to the data complement node QN, wherein a gate of the fifth transistor is coupled to the first node, wherein the sixth transistor is coupled to the data complement node QN, and wherein gates of the seventh and eighth transistors are coupled to the data node Q.

23. The hardening system of claim 22 wherein gates of the ninth and tenth transistors are coupled to a complement of one of the first and second terminals.

24. The hardening system of claim 23 wherein the first, second, fifth, sixth, ninth, and tenth transistors comprise corresponding p-channel transistors, and wherein the third, fourth, seventh, and eighth transistors comprise corresponding n-channel transistors.

25. The hardening system of claim 23 wherein the first, second, fifth, sixth, ninth, and tenth transistors comprise corresponding n-channel transistors, and wherein the third, fourth, seventh, and eighth transistors comprise corresponding p-channel transistors.

26. A hardening circuit for an integrated circuit having a data state reinforcing feedback path with a data node Q and a data complement node QN comprising:
   a first hardening transistor coupled between a rail and the data node Q, wherein the first hardening transistor is arranged to provide additional drive to the data node Q;
   a second hardening transistor couple between the rail and the data complement node QN, wherein the second hardening transistor is arranged to provide additional drive to the data complement node QN;
   a first gate control circuit couple to a gate of the second hardening transistor, wherein the first gate control circuit has a control input, wherein the control input is coupled to the data complement node QN, and wherein the first gate control circuit includes a first node;
   a second gate control circuit couple to a gate of the first hardening transistor, wherein the second gate control circuit has a control input, wherein the control input is coupled to the data node Q, and wherein the second gate control circuit includes a second node; and,
   a transistor circuit coupled to the first and second nodes so as to prevent the first and second nodes from floating.

27. The hardening circuit of claim 26 wherein the first node couples the second hardening transistor to the first gate control circuit, and wherein the second node couples the first hardening transistor to the second gate control circuit.

28. The hardening circuit of claim 26 wherein the first gate control circuit comprises first and second gate control transistors, wherein the second gate control circuit comprises third and fourth gate control transistors, and wherein the transistor circuit comprises a transistor.

29. The hardening circuit of claim 28 wherein the first and second hardening transistors and the transistor of the transistor circuit comprise corresponding p-channel transistors, and where the first, second, third, and fourth gate control transistors comprise corresponding n-channel transistors.

30. The hardening circuit of claim 28 wherein the first and second hardening transistors and the transistor of the transistor circuit comprise corresponding n-channel transistors, and where the first, second, third, and fourth gate control transistors comprise corresponding p-channel transistors.

31. The hardening circuit of claim 28 wherein the first and second gate control transistors are coupled in series between the first node and a clock input, and wherein the third and fourth gate control transistors are coupled in series between the second node and the clock input.

32. The hardening circuit of claim 31 wherein gates of the first and second gate control transistors are coupled to the data complement node QN, wherein gates of the third and fourth gate control transistors are coupled to the data node Q, and wherein a gate of the transistor of the transistor circuit is coupled to a complement of the clock input.

33. The hardening circuit of claim 26 wherein the first gate control circuit comprises first and second gate control transistors, wherein the second gate control circuit comprises third and fourth gate control transistors, and wherein the transistor circuit comprises a pair of transistors.

34. The hardening circuit of claim 33 wherein the first and second hardening transistors and the pair of transistors of the transistor circuit comprise corresponding p-channel transistors, and where the first, second, third, and fourth gate control transistors comprise corresponding n-channel transistors.

35. The hardening circuit of claim 33 wherein the first and second hardening transistors and the pair of transistors of the transistor circuit comprise corresponding n-channel transistors, and where the first, second, third, and fourth gate control transistors comprise corresponding p-channel transistors.

36. The hardening circuit of claim 33 wherein the first and second gate control transistors are coupled in series between the first node and a clock input, and wherein the third and fourth gate control transistors are coupled in series between the second node and the clock input.

37. The hardening circuit of claim 36 wherein gates of the first and second gate control transistors are coupled to the data complement node QN, wherein gates of the third and fourth gate control transistors are coupled to the data node Q, and wherein gates of the pair of transistors of the transistor circuit are coupled to a complement of the clock input.

38. A hardening system comprising:
a data storage device having a data input and a data output node, wherein the data storage device is arranged to provide drive to the data output node; and,
a hardening circuit coupled to the data output node, wherein the hardening circuit comprises
first and second transistor circuits forming a node therebetween, wherein the first transistor circuit is coupled to the data node so as to prevent the data node from changing states in the presence of radiation, and
a third transistor circuit coupled between a non-clock source terminal and the node so as to prevent the node from floating.

39. The hardening system of claim 38 wherein the first transistor circuit comprises a first transistor, wherein the second transistor circuit comprises second and third transistors, wherein the third transistor circuit comprises a fourth transistor, wherein the first transistor, the second transistor, and the third transistor are coupled in series, and wherein the node is between the first and second transistors.

40. The hardening system of claim 39 wherein gates of the second and third transistors are coupled to a complement of the data output node.

41. The hardening system of claim 40 wherein the first transistor, the second transistor, and the third transistor are coupled between a rail and a clock terminal, and wherein a gate of the fourth transistor is coupled to a complement of the clock terminal.

42. The hardening system of claim 41 wherein the first and fourth transistors comprise corresponding p-channel transistors, and wherein the second and third transistors comprise corresponding n-channel transistors.

43. The hardening system of claim 40 wherein a gate of the fourth transistor is coupled to a clock terminal, and wherein the first transistor, the second transistor, and the third transistor are coupled between a rail and a complement of the clock terminal.

44. The hardening system of claim 43 wherein the first and fourth transistors comprise corresponding n-channel transistors, and wherein the second and third transistors comprise corresponding p-channel transistors.

45. The hardening system of claim 38 wherein the first transistor circuit comprises a first transistor, wherein the second transistor circuit comprises second and third transistors, wherein the third transistor circuit comprises fourth and fifth transistors, wherein the first transistor, the second transistor, and the third transistor are coupled in series, and wherein the node is between the first and second transistor.

46. The hardening system of claim 45 wherein gates of the second and third transistors are coupled to a complement of the data output node.

47. The hardening system of claim 46 wherein the first transistor, the second transistor, and the third transistor are coupled between rail and a clock terminal, and wherein gates of the fourth and fifth transistors are coupled to a complement of the lock terminal.

48. The hardening system of claim 47 wherein the first, fourth, and fifth transistors comprise corresponding p-channel transistors, and wherein the second and third transistors comprise corresponding n-channel transistors.

49. The hardening system of claim 46 wherein gates of the fourth and fifth transistors are coupled to a clock terminal, and wherein the first transistor, the second transistor, and the third transistor are coupled between a rail and a complement of the clock terminal.

50. The hardening system of claim 49 wherein the first, fourth, and fifth transistors comprise corresponding n-channel transistors, and wherein the second and third transistors comprise corresponding p-channel transistors.

51. The hardening system of claim 1 wherein the fifth transistor circuit is coupled between a non-clock source terminal and the first and second nodes.

52. The hardening system of claim 51 wherein the non-clock source terminal comprises a ground terminal.

53. The hardening system of claim 51 wherein the non-clock source terminal comprises a terminal having a non-ground potential.

54. The hardening circuit of claim 26 wherein the transistor circuit is coupled between the rail and the first and second nodes.

55. The hardening system of claim 38 wherein the non-clock source terminal comprise a ground terminal.

56. The hardening system of claim 38 wherein the non-clock source terminal comprises a terminal having a non-ground potential.

* * * * *